US010789297B2

(12) United States Patent
Floyd et al.

(10) Patent No.: US 10,789,297 B2
(45) Date of Patent: *Sep. 29, 2020

(54) VISUALIZATION AND DIAGNOSTIC ANALYSIS OF INTERESTED ELEMENTS OF A COMPLEX SYSTEM

(71) Applicant: THE BOEING COMPANY, Chicago, IL (US)

(72) Inventors: Joseph F. Floyd, University Place, WA (US); Brent L. Hadley, Kent, WA (US); Patrick J. Eames, Newcastle, WA (US); Darren B. Macer, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/259,340

(22) Filed: Jan. 28, 2019

(65) Prior Publication Data

US 2019/0155849 A1 May 23, 2019

Related U.S. Application Data

(63) Continuation of application No. 14/464,909, filed on Aug. 21, 2014, now Pat. No. 10,191,997.

(51) Int. Cl.
*G06T 15/00* (2011.01)
*G06F 16/901* (2019.01)
(Continued)

(52) U.S. Cl.
CPC .......... *G06F 16/9024* (2019.01); *G06F 30/20* (2020.01); *G06T 19/20* (2013.01);
(Continued)

(58) Field of Classification Search
CPC ............................................... G06T 19/00–20
See application file for complete search history.

(56) References Cited

U.S. PATENT DOCUMENTS 5,341,466 A    8/1994  Perlin et al.
5,418,719 A    5/1995  Abe et al.
                (Continued)

FOREIGN PATENT DOCUMENTS

CN       101689313 A      3/2010
CN       103116537 A      5/2013
              (Continued)

OTHER PUBLICATIONS

Notice of Reasons for Rejection dated Jun. 25, 2019; Japanese Patent Application No. JP2015-155644.
(Continued)

*Primary Examiner* — Charles Tseng
(74) *Attorney, Agent, or Firm* — Womble Bond Dickinson LLP

(57) ABSTRACT

An apparatus is provided for implementation of a system for visualization and diagnostic analysis of a complex system such as an aircraft composed of a plurality of elements. The apparatus may receive and process data for a physical instance of the complex system to identify a maintenance message for the complex system. A diagnostic procedure defined for and associated with the maintenance message, may involve or implicate one or more interested elements of the plurality of elements. The apparatus may generate a visual presentation of at least a portion of the complex system. The visual presentation may be digital media and depict the interested element(s) and one or more other elements of the plurality of elements. And the apparatus may apply a visual effect to the interested element(s) depicted by the visual presentation to distinguish the interested element(s) from the other element(s) depicted by the visual presentation.

18 Claims, 4 Drawing Sheets

(51) Int. Cl.
*H04L 12/26* (2006.01)
*G06T 19/20* (2011.01)
*H04L 12/24* (2006.01)
*G06F 30/20* (2020.01)

(52) U.S. Cl.
CPC .......... *H04L 41/0631* (2013.01); *H04L 41/22* (2013.01); *H04L 43/045* (2013.01); *G06T 2219/2012* (2013.01); *Y02T 10/82* (2013.01)

(56) References Cited

U.S. PATENT DOCUMENTS

| | | | |
|---|---|---|---|
| RE36,145 E | 3/1999 | DeAguiar et al. | |
| 6,650,998 B1 | 11/2003 | Rutledge et al. | |
| 6,684,087 B1 | 1/2004 | Yu et al. | |
| 6,704,024 B2 | 3/2004 | Robotham et al. | |
| 6,766,331 B2 | 7/2004 | Shema et al. | |
| 7,200,271 B2 | 4/2007 | Boose et al. | |
| 7,246,328 B2 | 7/2007 | Boose et al. | |
| 7,365,747 B2 | 4/2008 | Finlayson et al. | |
| 7,783,644 B1 | 8/2010 | Petrou et al. | |
| 7,802,204 B2 | 9/2010 | Merry et al. | |
| 7,870,224 B1 | 1/2011 | Maigatter | |
| 7,872,650 B2 | 1/2011 | Fay | |
| 7,912,602 B2 | 3/2011 | Sells et al. | |
| 7,921,452 B2 | 4/2011 | Ridlon et al. | |
| 8,051,031 B2 | 11/2011 | Sims, III et al. | |
| 9,477,223 B2 | 10/2016 | Shaikh et al. | |
| 2003/0055812 A1 | 3/2003 | Williams et al. | |
| 2003/0055871 A1 | 3/2003 | Roses | |
| 2003/0100964 A1 | 5/2003 | Kluge et al. | |
| 2004/0003097 A1 | 1/2004 | Willis et al. | |
| 2004/0028294 A1 | 2/2004 | Fukuda | |
| 2004/0073411 A1 | 4/2004 | Alston et al. | |
| 2004/0093564 A1 | 5/2004 | Kumhyr et al. | |
| 2004/0223648 A1 | 11/2004 | Hoene et al. | |
| 2004/0267701 A1 | 12/2004 | Horvitz et al. | |
| 2005/0273230 A1 | 12/2005 | Steinmeier et al. | |
| 2006/0161863 A1 | 7/2006 | Gallo | |
| 2007/0094615 A1 | 4/2007 | Endo et al. | |
| 2007/0226605 A1 | 9/2007 | Thomas | |
| 2008/0004764 A1 | 1/2008 | Chinnadurai et al. | |
| 2008/0074423 A1 | 3/2008 | Gan et al. | |
| 2008/0111813 A1 | 5/2008 | Gatzke et al. | |
| 2008/0247636 A1 | 10/2008 | Davis et al. | |
| 2008/0263399 A1 | 10/2008 | Cousin et al. | |
| 2009/0005928 A1 | 1/2009 | Sells et al. | |
| 2009/0086014 A1 | 4/2009 | Lea et al. | |
| 2009/0086199 A1 | 4/2009 | Troy et al. | |
| 2009/0112820 A1 | 4/2009 | Kessel et al. | |
| 2009/0138139 A1 | 5/2009 | Tsai et al. | |
| 2009/0138141 A1 | 5/2009 | Nwadiogbu et al. | |
| 2009/0317020 A1 | 12/2009 | Gerhard et al. | |
| 2010/0042361 A1 | 2/2010 | Hadley et al. | |
| 2010/0102980 A1 | 4/2010 | Troy et al. | |
| 2010/0223269 A1 | 9/2010 | Shuf et al. | |
| 2010/0229115 A1 | 9/2010 | Augustine et al. | |
| 2010/0306696 A1 | 12/2010 | Groth et al. | |
| 2011/0087463 A1 | 4/2011 | Nakhle et al. | |
| 2011/0087513 A1 | 4/2011 | Floyd et al. | |
| 2011/0149266 A1 | 6/2011 | Motzer et al. | |
| 2011/0235858 A1 | 9/2011 | Hanson et al. | |
| 2012/0066301 A1 | 3/2012 | Holland | |
| 2012/0188248 A1 | 7/2012 | Eames et al. | |
| 2012/0221625 A1 | 8/2012 | Troy et al. | |
| 2012/0239452 A1 | 9/2012 | Trivedi et al. | |
| 2013/0339795 A1 | 12/2013 | Petri et al. | |

FOREIGN PATENT DOCUMENTS

| | | | |
|---|---|---|---|
| EP | 1 176 520 A2 | 1/2002 | |
| EP | 1 503 301 A2 | 2/2005 | |
| EP | 1 860 573 A1 | 11/2007 | |
| EP | 2 482 538 A1 | 8/2012 | |
| EP | 2 642 414 A2 | 9/2013 | |
| JP | 2003-285701 A | 10/2003 | |
| JP | 2014-2731 A | 1/2014 | |
| WO | 2009005949 A1 | 1/2009 | |
| WO | 2009048963 | 4/2009 | |
| WO | 2009085476 | 7/2009 | |

OTHER PUBLICATIONS

Office Action from corresponding Chinese Patent Appl. No. 2015105186976, dated Sep. 29, 2019.
"About Deep Zoom Composer," Microsoft, Copyright 2011 [retrieved on Nov. 23, 2011] Retrieved using Internet <URL: http://msdn.microsoft.com/en-us/library/dd409068(d=printer).aspx; 4 pages.
Airframe & Powerplant Mechanics General Handbook, US Department of Transportation Federal Aviation Administration, Chapter 2, Mar. 31, 1999; pp. 35-52.
Cohn, "Back to Flat—Producing 2D Output from 3D Models," Autodesk University 2009, Dec. 11, 2009, pp. 1-14.
"Data differencing," 2012, Wikipedia, The Free Encyclopedia, [retrieved on Jul. 9, 2012] Retrieved using Internet <URL: http://en.wikipedia.org/w/index.php?title=Data_differencing&printable=yes, 3 pages.
"Deep Zoom," Mar. 2008, Wikipedia, The Free Encyclopedia, [retrieved on Apr. 18, 2012] Retrieved using Internet <URL: http://en.wikipedia.org/wiki/DeepZoom; 4 pages.
European Search Report dated May 25, 2012 for European Application No. 12 152 591.9, 13 pages.
European Search Report dated Mar. 6, 2013 for European Application No. 12 198 374.6, 7 pages.
European Search Report dated Mar. 12, 2013 for European Application No. 12 198 679.8, 8 pages.
European Search Report dated Mar. 19, 2013 for European Application No. 12 195 735.1, 7 pages.
European Search Report dated Aug. 7, 2013 for European Application No. 13 160 361.5; 6 pages.
European Search Report dated Sep. 2, 2013 for European Application No. 13 160 848.1; 6 pages.
European Search Report dated Dec. 12, 2013 for European Application No. 13 184 0845, 6 pages.
European Search Report dated Feb. 10, 2014 for European Application No. 13 194 943.0, 6 pages.
European Search Report dated Apr. 4, 2014 for European Application No. 14 152 644.2, 8 pages.
European Search Report dated Apr. 4, 2014 for European Application No. 14 152 646.7, 9 pages.
Fitzpatrick et al., "Analytical Method for the Prediction of Reliability and Maintainability Based Life-Cycle Labor costs," Journal of Mechanical Design, vol. 121, Issue 4, 1999, 24 pages.
"Futuristic software from Minority Report is real," published Jul. 23, 2012, [retrieved on Aug. 30, 2012] Retrieved using Internet <URL: http://www.foxnews.com/tech/2012/07/23/futuristic-software-from-minority-report-is-real/; 3 pages.
"Hard Rock Memorabilia," Copyright 2009, Hard Rock Cafe International, Inc., [retrieved on Apr. 18, 2012] Retrieved using Internet <URL: http://memorabilia.hardrock.com, 2 pages.
Hunter, "Theodolite, Documentation/Help/FAQ," Apr. 24, 2012, Hunter Research and Technology LLC [retrieved on Dec. 14, 2012] Retrieved using Internet <URL: http://hunter.pairsite.com/mobile/theodolite/help/, 6 pages.
International Search Report dated Dec. 21, 2012 for PCT/US2012/054808, 4 pages.
International Search Report dated Jan. 18, 2013 for PCT/US2012/058937, 4 pages.
Li et al., "Automated Generation of Interactive 3D Exploded View Diagrams," ACM Transactions on Graphics, vol. 27, No. 3, Aug. 1, 2008, 7 pages.
Petre et al., "3D Model-based Semantic Labeling of 2D Objects," 2011 International Conference on Digital Image Computing: Techniques and Applications (DICTA), IEEE, Dec. 6, 2011, pp. 152-157.
Quintana et al., "Will Model-based Definition replace engineering drawings throughout the product lifecycle? A global perspective from aerospace industry," copyright 2010, Computers in Industry, vol. 61, pp. 497-508.

(56) References Cited

OTHER PUBLICATIONS

Rao et al., "Rich Interaction in the Digital Library," Communications of the ACM, Association for Computing Machinery, Inc., United States, vol. 38, No. 4, Apr. 1995, pp. 29-39.
"Reliability and Maintainability Definitions," System Reliability Center, Rome, NY; IIT Research Institute, 2001, 2 pages.
Tatzgern et al., "Multi-perspective Compact Explosion Diagrams," Computers & Graphics, vol. 35, No. 1, Feb. 1, 2011, pp. 135-147.
Written Opinion dated Dec. 21, 2012 for PCT/US2012/054808, 6 pages.
Written Opinion dated Jan. 18, 2013 for PCT/US2012/058937, 9 pages.

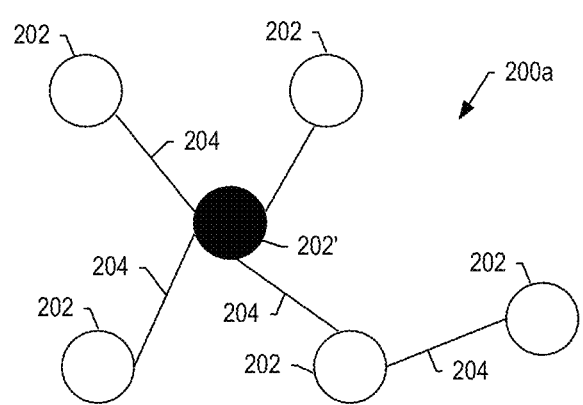
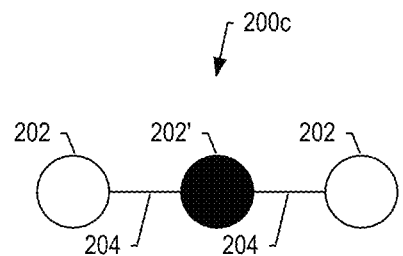
FIG. 2A
FIG. 2C
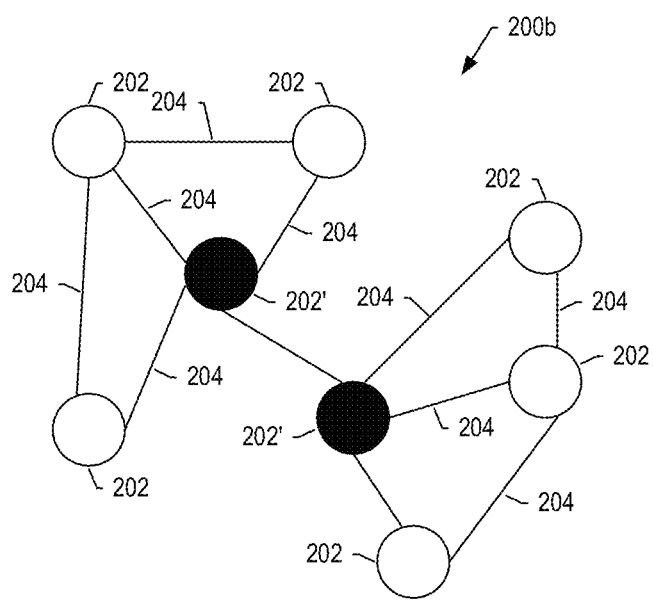
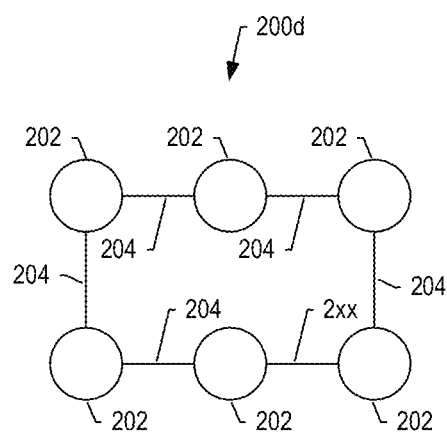
FIG. 2B
FIG. 2D

VISUALIZATION AND DIAGNOSTIC ANALYSIS OF INTERESTED ELEMENTS OF A COMPLEX SYSTEM

CROSS-REFERENCE TO RELATED APPLICATION(S)

The present application is a continuation of U.S. patent application Ser. No. 14/464,909, filed Aug. 21, 2014, entitled: Visualization and Diagnostic Analysis of Interested Elements of a Complex System, now U.S. Pat. No. 10,191,997, issued Jan. 29, 2019, the content of which is incorporated herein by reference in its entirety.

TECHNOLOGICAL FIELD

The present disclosure relates generally to analysis of a complex system and, in particular, to diagnostic analysis of a complex system through visual presentation of digital media depicting elements of the complex system in which a visual effect is applied to distinguish one or more elements involved in or implicated by a diagnostic procedure.

BACKGROUND

Advances in the design of many complex systems such as those in the aerospace, automotive, marine and electronics industries have led to the development of numerous mutually-dependent systems. Failures or malfunctions of one or more of these systems often affect other systems, directly or indirectly. Additionally, diagnostics and other analysis of these failures/malfunctions and their direct and indirect effects is often required as part of a certification process. Typically such analyses are manually performed by groups of system analysts, without reference to a system or process capable of facilitating such analyses.

In aircraft programs with federated systems, failure analyses can be straightforward, and usually involve a limited number of systems with easily-understood cascading aircraft-level effects. When performed on complex aircraft systems with highly-integrated architectures, on the other hand, failure analyses can involve many systems with complex cascading effects and aircraft-level impacts that are not easily understood without a complete picture of the event.

Various systems and methods currently exist for performing failure analyses of specific aircraft systems. But these current systems and methods do not always draw attention to all of the systems involved in or implicated by a particular failure/malfunction, or any key systems that may more likely be the root cause of multiple failures/malfunctions. These systems and methods also thus do not visually present data for performing failure analyses in an easily-interpretable manner. Therefore, it may be desirable to have an apparatus and method that takes into account at least some of the issues discussed above, as well as possibly other issues.

BRIEF SUMMARY

Example implementations of the present disclosure are generally directed to an apparatus for implementation of a system for visualization and diagnostic analysis of interested elements of a complex system composed of a plurality of elements, and corresponding method and computer-readable storage medium. Example implementations may aggregate information beneficial for resolution of a problem or to a spot trend that may involve one or more elements on one or more physical instances of a complex system. Example implementations may then display that information in an informative and visual manner, which may be associated with the three-dimensional (3D) context of the complex system, so that it may be easily understood and quickly analyzed.

A complex system such as an aircraft may be composed of a plurality of elements, and at times, one or more of these elements may be involved in or implicated by a diagnostic process, and may therefore be considered interested. In accordance with example implementations, a visual presentation of at least a portion of the complex system may be generated, and the visual presentation may depict the interested element(s) and one or more other elements of the complex system. Before, after or as the visual presentation is generated, a visual effect may be applied to the interested element(s) to distinguish them from the other element(s) depicted by the visual presentation. This may further facilitate diagnostic analysis of the interested element(s), and in some examples may facilitate resolution of a failed element of the complex system.

According to one aspect of example implementations, the apparatus includes a processor and a memory storing executable instructions that in response to execution by the processor cause the apparatus to at least perform a number of functions or operations. In accordance with this aspect, the apparatus may be caused to receive and process data for a physical instance of a complex system such as an aircraft composed of a plurality of elements. Here, the data may be received and processed to identify a maintenance message for the complex system, and a diagnostic procedure defined for and associated with the maintenance message, and which diagnostic procedure may involve or implicate one or more interested elements of the plurality of elements. In some examples, a plurality of maintenance messages and diagnostic procedures may be identified; and in these examples, the diagnostic procedures may involve or implicate a plurality of interested elements.

The apparatus may be caused to generate a visual presentation of at least a portion of the complex system, with the visual presentation being digital media and depicting the interested element(s) and one or more other elements of the plurality of elements. The apparatus may be caused to apply a visual effect to the interested element(s) depicted by the visual presentation to distinguish the interested element(s) from the other element(s) depicted by the visual presentation. In some examples, the visual presentation may be of at least a portion of a three-dimensional (3D) model of the complex system; and in these examples, the visual effect may be applied to 3D objects of the 3D model that correspond to the interested element(s).

In some examples, a plurality of interested elements may include a first one or more interested elements involved or implicated by a first of the diagnostic procedures, and a second one or more interested elements involved in or implicated by a second of the diagnostic procedures. In these examples, the apparatus may be caused to vary a property of the visual element applied between the first interested element(s) and second interested element(s) to distinguish the first interested element(s) and second interested element(s) from one another.

In some examples, the memory may store further executable instructions that in response to execution by the processor cause the apparatus to further analyze the plurality of interested elements to identify a key interested element from the plurality of interested elements. In these examples, the apparatus may be caused to vary a property of the visual effect applied to the key interested element, or apply a second visual effect to the key interested element, to further distinguish the key interested element from other interested elements of the plurality of interested elements.

In some further examples, the apparatus being caused to analyze the plurality of interested elements may include being caused to generate and analyze a graph including a plurality of vertices connected by one or more edges. For the graph, the vertices may correspond to respective elements of the plurality of interested elements, and the edge(s) may represent respective connection(s) between the elements (to which the vertices correspond). The graph may then be analyzed to identify a key vertex from the plurality of vertices, with the key vertex corresponding to the key interested element of the plurality of interested elements.

In other aspects of example implementations, a method and computer-readable storage medium are provided for visualization and analysis of interested elements of a complex system. The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example embodiments of the disclosure in general terms, reference will now be made to the accompanying drawings, which are not necessarily drawn to scale, and wherein:

FIGS. 2A, 2B, 2C and 2D illustrate various graphs corresponding to connected elements of a complex system, in accordance with example implementations.

DETAILED DESCRIPTION

Figure 1:
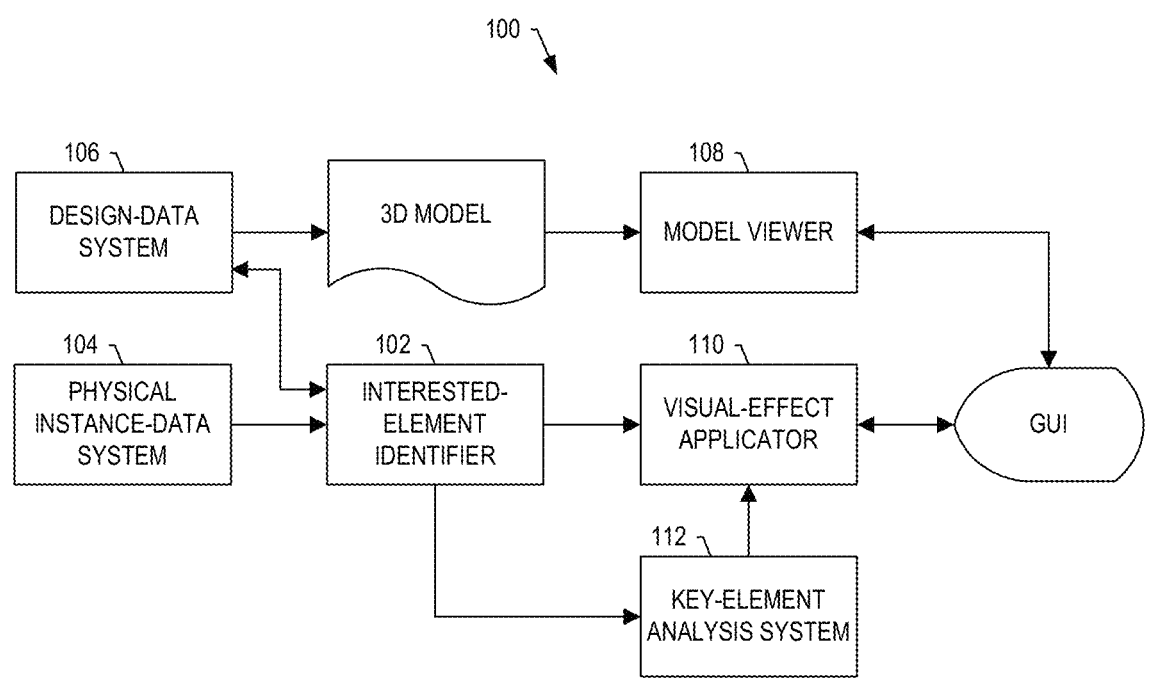
FIG. 1 is an illustration of a visualization and diagnostic analysis system in accordance with an example implementation.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure relate generally to analysis of a complex system. A complex system may refer to any of a number of physical structures such as an aircraft composed of one or more components, subsystems or the like (each generally referred to as a "subsystem"), with each subsystem being composed of one or more parts, and each part including one or more features. In this regard, the parts of the complex system may be assembled into a number of subsystems, which in turn may be assembled into the complex system. In the context of an aircraft, one or more parts or subsystems may be designed as a modular component of the aircraft often referred to as a line-replaceable unit (LRU), of which a single aircraft may include a number of LRUs and other parts or subsystems. Any of the complex system itself or any of its subsystems, parts (of subsystems), features (of parts) or the like may at times be generally referred to as an "element" of the complex system.

More particularly, various example implementations relate to diagnostic analysis of a complex system through visual presentation of digital media depicting elements of the complex system in which a visual effect is applied to distinguish one or more elements involved in or implicated by a diagnostic procedure. Example implementations will be primarily described in conjunction with aerospace applications. It should be understood, however, that example implementations may be utilized in conjunction with a variety of other applications, both in the aerospace industry and outside of the aerospace industry. Furthermore, it should be understood that unless otherwise specified, the terms "data," "content," "information," and similar terms may be at times used interchangeably.

Referring now to FIG. 1, a visualization and diagnostic analysis system 100 is illustrated according to example implementations of the present disclosure. The system may include any of a number of different subsystems (each an individual system) for performing one or more functions or operations with respect to visual presentations of digital media depicting elements of a complex system, which may be two-dimensional (2D) or three-dimensional (3D). As shown, for example, the system may include an interested-element identifier 102, information systems 104, 106, model viewer 108, visual-effect applicator 110 and/or key-element analysis system 112.

Although being shown as part of the visualization and diagnostic analysis system 100, one or more of the interested-element identifier 102, information systems 104, 106, model viewer 108, visual-effect applicator 110 and/or key-element analysis system 112 may instead be separate from but in communication with the visualization and diagnostic analysis system. It should also be understood that one or more of the subsystems may function or operate as a separate system without regard to others of the subsystems. And further, it should be understood that the visualization and diagnostic analysis system may include or be coupled to one or more additional or alternative systems, subsystems or the like. One example of a suitable system is an integrated visualization and analysis system such as that disclosed by U.S. patent application Ser. No. 14/464,904, entitled: Integrated Visualization and Analysis of a Complex System, filed Aug. 21, 2014, now U.S. Pat. No. 9,841,870, the content of which is hereby incorporated by reference in its entirety.

Turning now to the subsystems of the visualization and diagnostic analysis system 100, the interested-element identifier 102 may be configured to receive and process data for a physical instance of a complex system such as an aircraft composed of a plurality of elements. In some examples, the data may include data related to the physical instance, and design data related to the complex system (and not necessarily specific to the physical instance). The interested-element identifier may receive and process the data to identify a maintenance message for the complex system. The interested-element identifier may also identify a diagnostic procedure defined for and associated with the maintenance message, and the diagnostic procedure may involve or implicate one or more interested elements of the plurality of elements. In some examples, a plurality of maintenance messages and diagnostic procedures may be identified; and in these examples, the diagnostic procedures may involve or implicate a plurality of interested elements.

In some examples, data related to the physical instance may include data related to one or more failures or other events in the complex system, where a failure may refer to a malfunction, degradation or failure in the complex system. In some examples, the data may include or identify one or more maintenance messages, or the data may be capable of analysis by the interested-element identifier 102 to identify one or more maintenance messages. These maintenance messages may be predefined for the complex system and identify or describe (the terms being synonymous herein, and at times generally referred to as "identify") an element-level failure, and in various instances, one or more effects of the element-level failure. The effects of an element-level failure may include one or more direct effects, and in various instances, one or more indirect effects, each of which may manifest itself as a failure (and may itself be identified by a maintenance message). An aircraft, for example, may experience failure of an aircraft electrical bus or navigational system. This failure may in turn lead to direct effects such as hydraulic effects, navigational effects and/or avionics effects, any one or more of which may lead to one or more indirect effects. For example, a hydraulic effect may lead to a flight control effect, which in turn may lead to an air frame vibration effect.

The design data may include, for example, data related to one or more diagnostic procedures that may be performed to address failures in the complex system, and which in some examples may be defined for and associated with respective maintenance messages. A diagnostic procedure may include one or more actions that may be taken, and which may involve (user) interaction with one or more elements of the complex system. These elements may be identified as interested elements and include a failed element or one or more elements that may be checked or otherwise interacted with to identify the failed element. These interested elements may be considered involved in a diagnostic procedure, and at least some of them may be connected to one another, directly or indirectly through one or more intermediate elements that may thereby be implicated by the diagnostic procedure. The connection between elements may be of any of a number of suitable types, such as physical, electrical, hydraulic, airflow, data communication, fluid or the like. In some examples, the connection may be a logical connection such as in the case of elements connected by a common or related function of the elements in the complex system.

To facilitate the interested-element identifier 102 determining the connections between elements involved in a diagnostic procedure and thus elements that may be implicated by the diagnostic procedure, in some examples, the design data may also include data that describes the complex system and various ones of its elements. This design data may include, for example, one or more models, schematic diagrams or the like. Additionally or alternatively, for example, the design data may include logical interface information that may describe logical connections between elements, which may be reflected by logical interfaces between respective elements. One example of suitable logical interface information is that provided by an interface control document (ICD). Further, for example, the design data may include a list of one or more complex-system-level functions and one or more elements of the complex system that implement the respective functions.

To acquire the data from which to identify the interested element(s), the interested-element identifier 102 may be coupled to any of a number of different computer-based sources of data, information systems or the like, generally referred to at times as information systems. As shown, for example, the topical-element identifier may be coupled to one or more information systems 104 configured to collect data related to the physical instance, and one or more information systems 106 configured to collect design data related to the complex system, although not necessarily specific to the physical instance. These information systems may in turn receive the data from any of a number of different sources. For example, the information systems may receive data directly from an operator such as through data entry techniques. In another example particular to data for the physical instance, the information system may be configured to receive data directly from the physical instance of the complex system, which may be equipped with one or more sensors or embedded systems configured to transmit a signal such as in the event it or one of its elements experiences a failure.

In yet another example particular to data for the physical instance, the information system 104 may receive data from any of a number of other information systems configured to collect content related to the physical instance, such as in the form of email messages, items of user-generated content in the form of Internet forums, weblogs, social blogs, microblogging, wikis, social networks and the like. In this other example, the content may itself specifically identify a maintenance message, from which a diagnostic procedure and interested element(s) may be identified. Or the content may include content that may be analyzed by the information system to identify the maintenance message such as through an analysis of the content to identify a most relevant maintenance message to which the content may be related.

In addition to the interested-element identifier 102, the visualization and diagnostic analysis system 100 may include a viewer configured to generate digital media in the form of a visual presentation of at least a portion of the complex system, and depicting the interested element(s) and one or more other elements of the plurality of elements. In some examples, the visual presentation may be a two-dimensional (2D) image of the portion of the complex system. In other examples, as shown, the visual presentation may be at least a portion of a digital three-dimensional (3D) model of the complex system, such as a 3D CAD or other similar model (sometimes referred to as a solid model).

In one example, the 3D model may represent the complex system as a collection of "primitives" such as edges, faces, points (e.g., vertices) and the like, which may be arranged into polygons or other arithmetically-derived structures to reflect the geometry of surfaces, volumes or elements of the respective complex system. The complex system may be defined by a "boundary" representation, or collection of polygons that demarcate the space occupied by the complex system, which may include sub-collections of polygons that demarcate spaces occupied by respective elements of the complex system. Each of these sub-collections of polygons may be referred to as a 3D object that corresponds to an element of the complex system in the 3D model. For some complex systems, the 3D model may use hundreds of thousands of polygons, which may be arranged in thousands of sub-collections of polygons (3D objects) corresponding to several thousands of elements.

The 3D model may include information that may indicate a design type of the model, such as an art concept, preliminary design, released design or the like. The 3D model may include information (e.g., name, number, quantity, source, position, related elements) similar to that described above for a list of information regarding the complex system and/or one or more of its elements. The 3D model may even further include additional information that in some examples, with the 3D model, may compose a model-based definition (MBD) of the complex system. For example, the 3D model may include product manufacturing information (PMI) such as geometric dimensions and tolerances (GD&T), material specifications, component lists, process specifications, inspection requirements or the like. This information may convey engineering intent (EI), which may reflect the designer's intent for how the complex system should be fabricated, assembled, operated, maintained or the like. In various examples, this additional information may be provided directly in the 3D model, or in metadata associated with the 3D model.

In some examples, then, the viewer may be a model viewer 108 capable of receiving a digital 3D model of the complex system, such as from the information system 106 in the form of further design data for the complex system. The model viewer may be capable of interpreting the 3D model, and configured to produce a visual presentation of at least a portion of the 3D model such as in a suitable GUI. The model viewer may be configured to produce the visual presentation in accordance with a number of techniques, such as those employed by CAD viewers, virtual reality modeling language (VRML) viewers, X3D viewers, Java 3D viewers, QuickTime virtual reality (VR) or QTVR viewers, integrating vision toolkit (IVT) viewers or the like.

As indicated above, the visual presentation of at least a portion of the complex system may depict the interested element(s) and other element(s) of the complex system. The visualization and diagnostic analysis system 100 may include a visual-effect applicator 110 coupled to the interested-element identifier 102, and configured to apply a visual effect to the interested element(s) depicted by the visual presentation to distinguish the interested element(s) from the other element(s) depicted by the visual presentation. The visual effect may be any of a number of different effects. Examples of suitable visual effects include an opaque or translucent outline of a noticeable color around the one or more 3D objects that correspond to the interested element(s), or an opaque or translucent fill of a noticeable color applied to the entire 3D objects for the interested elements. The interested element(s) may be keyed to their 3D objects in any of a number of different manners, such as by identifiers (e.g., part numbers) of the interested element(s).

In some examples involving multiple maintenance messages and diagnostic procedures, the interested elements may include a first one or more interested elements involved or implicated by a first of the diagnostic procedures, and a second one or more interested elements involved in or implicated by a second of the diagnostic procedures. In these examples, the visual-effect applicator 110 may be configured to vary a property of the visual element applied between the first and second interested element(s) to distinguish them from one another. In the case of a colored outline or fill, for example, one or more properties of the color such as its hue, value and/or intensity may vary between the first and second interested element(s).

In various instances, it may be desirable to convey additional information in the visual effect applied to the interested elements, such as may reflect one or more key interested element(s). In some examples, then, the visualization and diagnostic analysis system 100 may further include a key-element analysis system 112 coupled to the configured to the interested-element identifier 102 and visual-effect applicator 110. The key-element analysis system may be configured to further analyze the plurality of interested elements to identify a key interested element from the plurality of interested elements.

The key-element analysis system 112 may analyze the interested elements in any of a number of different manners, such as in accordance with a graph-based technique. In some examples, the key-element analysis system may be configured to generate and analyze a graph including a plurality of vertices connected by one or more edges. For the graph, the vertices may correspond to respective elements of the plurality of interested elements, and the edge(s) may represent respective connection(s) between the elements (to which the vertices correspond). In some examples, the edges may be weighted to reflect a variance in the connections between various elements to which the vertices correspond. For example, the edges may be weighted to reflect a number of hops between the connected elements. The key-element analysis system may then analyze the graph to identify a key vertex from the plurality of vertices, with the key vertex corresponding to the key interested element of the plurality of interested elements. In some examples, this key vertex may be the vertex with the greatest number of edges to other vertices. Or in some examples, the key vertex may be the vertex with the greatest weighted sum of edges to other vertices.

FIGS. 2A, 2B, 2C and 2D illustrate various graphs 200a, 200b, 200c and 200d that may be generated by the key-element analysis system 112 of example implementations. As shown, the graphs may include vertices 202 connected by one or more edges 204. In graph 200a, one of the vertices 202' has the greatest number of edges to other vertices, and may thereby be identified as the key vertex, and the element of the complex system to which it corresponds thereby being identified as a key interested element. In graph 202b, two of the vertices 202' equally have the greatest number of edges, and so both may be identified as key vertices, and their elements as key interested elements. Graph 202c also has one vertex with the greatest number of edges, and so it and its element may be identified as key. Finally, in graph 202d, all of the vertices have an equal number of edges. Here, none of the vertices may be identified as key. Or in some examples, all of the vertices in graph 202d may be identified as key, and with mostly the same effect.

Regardless of the exact manner by which the key-element analysis system 112 identifies a key interested element, the visual-effect applicator 110 may then address the key interested element in the visual representation of the portion of the complex system depicting the interested element(s) and other element(s). For example, the visual-effect applicator may vary a property of the visual effect (e.g., vary the hue of a colored fill) applied to the key interested element. Additionally or alternatively, for example, the visual-effect applicator may apply a second visual effect (e.g., a colored outline) to the key interested element, to further distinguish the key interested element from other interested elements of the plurality of interested elements.

As mentioned above, the visualization and diagnostic analysis system 100 may include or be coupled to one or more additional or alternative systems, subsystems or the like, such as the integrated visualization and analysis system disclosed by the '904 application cited and incorporated above. The integrated visualization and analysis system may be generally configured to integrate data for a physical instance of a complex system, visual presentation of a 3D model of the complex system, and layout of panoptically-arranged document components at least some of which include 2D images depicting at least some of the elements. Through this integration, integrated visualization and analysis system may produce a visual definition of the complex system for visualization and analysis. In the visual definition, the 3D model or one or more 2D images may depict elements of the complex system for which the visualization and diagnostic analysis system may identify interested element(s). The visualization and diagnostic analysis system may then apply a visual effect to those interested element(s) in the visual definition, which when provided in the visual definition with other data for the complex system, may facilitate analysis of the complex system.

To even further illustrate example implementation of the present disclosure, reference will now be made to FIGS. 3 and 4, which depict example layouts of pages that may be displayed in a GUI that has a predetermined viewable area 300 in which at least a portion of a visual definition of an aircraft is displayed. As shown, the viewable area may be divided into a plurality of portions, frames or the like in which information-based components of the visual definition may be displayed. For example, the viewable area may include a first portion 302 in which data for a physical instance of the aircraft may be displayed. As shown, for example, this data may include a list of parts from an indentured parts list. The viewable area may include a second portion 304 in which either or both of the visual presentation of a 3D model of the aircraft, or a layout of pages depicting elements of the aircraft may be displayed, and a third portion 306 in which additional data for elements of the aircraft may be displayed. As shown, the second portion is displaying a visual presentation of the 3D model of the aircraft.

The third portion 306 may display logical data regarding the aircraft for which the visual presentation of the 3D model is displayed in the second portion 304. This data may include, for example, one or more systems, wires and electrical equipment (e.g., boxes) that are electrically connected, and may therefore constitute interested elements involved in the diagnostic procedure defined for and associated with a particular maintenance message. The wires that are traced may be shown in the logical data. This may allow the user to better understand the maintenance message and its associated diagnostic procedure.

In the visual presentation of the 3D model, color may be applied to some of the elements of the aircraft identified as being interested, and in which the hue or some other property of the color may be varied with one or more of the interested elements being identified as key. As shown in FIG. 3, for example, interested elements 308 to which color has been applied may reflect elements involved in or implicated by a diagnostic procedure. The color may distinguish these elements from other depicted elements 310 of the aircraft.

Figure 3:
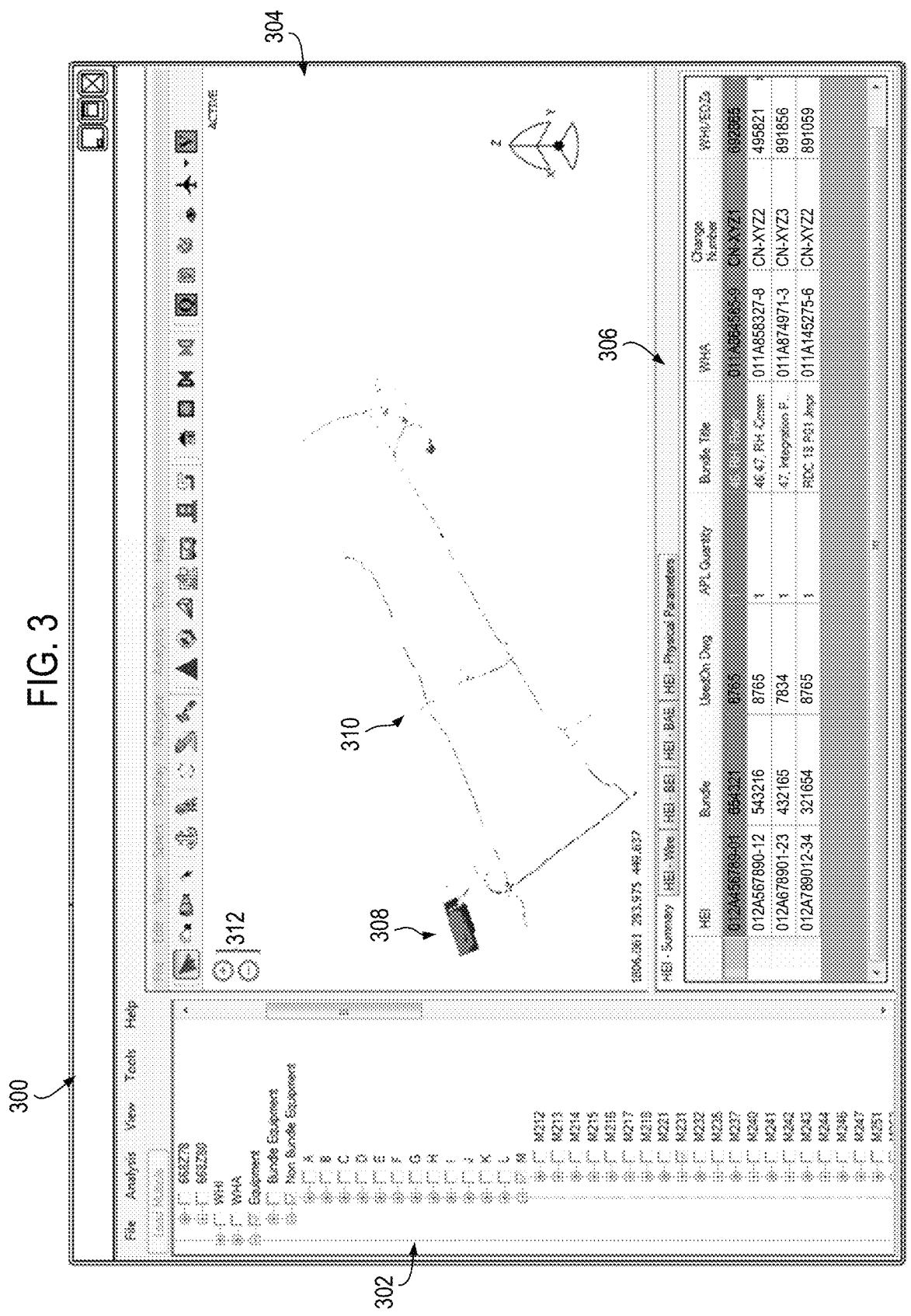
FIGS. 3 and 4 depict example layouts of pages that may be displayed in a GUI that has a predetermined viewable area, and which may be navigated by a user, according to example implementations of the present disclosure.
Figure 4:
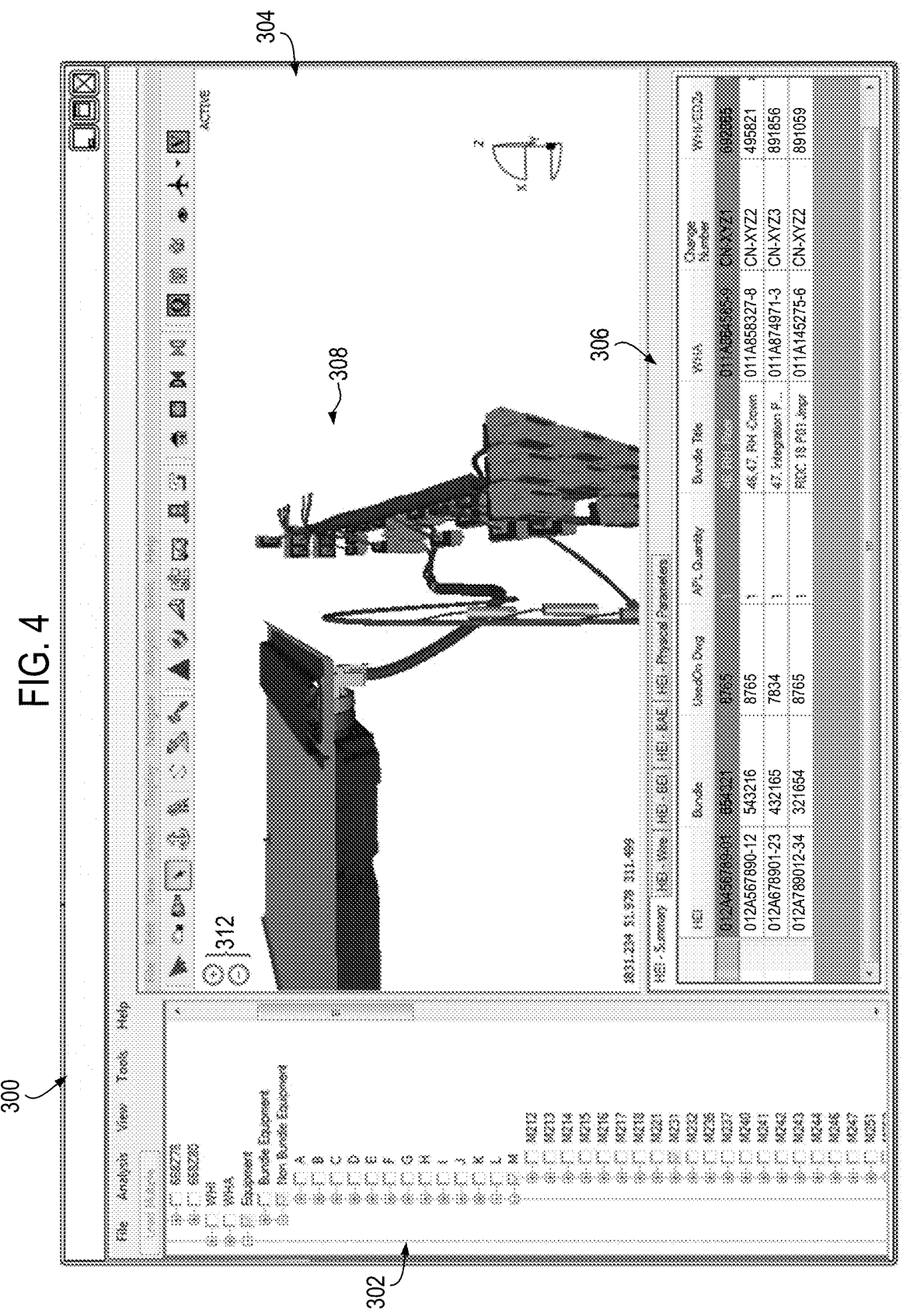

As shown in FIG. 3, the interested elements 308 are a battery and battery charger of an aircraft. Elsewhere, the 3D model depicts a remote data concentrator (RDC) that routes signals within the aircraft, as well as an electrical module that runs software to drive various elements. The interested elements may be those that are electrically connected, and therefore may be involved in a fault troubleshooting procedure (diagnostic procedure). In this regard, the procedure may call a connector on the battery and the electrical module, but make no reference to the RDC or battery charger either or both of which could be at fault.

The GUI also may present one or more selected navigation options for navigating the information-based components. In this illustrative example, pan and zoom navigation options may be presented in the form of controls 312 to move and/or increase the size of the visual presentation of the 3D model to focus on a portion of it, such as the portion in which the interested elements are depicted. In other words, the user may activate the aforementioned controls to move and/or zoom the visual presentation of the 3D model to fill a greater portion of the viewable area of the GUI with the interested elements. FIG. 4 illustrates one example of the result of navigating the visual presentation in this manner.

According to example implementations of the present disclosure, the visualization and diagnostic analysis system 100 and its subsystems including the interested-element identifier 102, information systems 104, 106, model viewer 108, visual-effect applicator 110 and key-element analysis system 112 may be implemented by various means. Means for implementing the systems, subsystems and their respective elements may include hardware, alone or under direction of one or more computer program code instructions, program instructions or executable computer-readable program code instructions from a computer-readable storage medium.

In one example, one or more apparatuses may be provided that are configured to function as or otherwise implement the systems, subsystems and respective elements shown and described herein. In examples involving more than one apparatus, the respective apparatuses may be connected to or otherwise in communication with one another in a number of different manners, such as directly or indirectly via a wireline or wireless network or the like.

Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor (e.g., processor unit) connected to a memory (e.g., storage device).

The processor is generally any piece of hardware that is capable of processing information such as, for example, data, computer-readable program code, instructions or the like (generally "computer programs," e.g., software, firmware, etc.), and/or other suitable electronic information. More particularly, for example, the processor may be configured to execute computer programs, which may be stored onboard the processor or otherwise stored in the memory (of the same or another apparatus). The processor may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory is generally any piece of hardware that is capable of storing information such as, for example, data, computer programs and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium which, as a non-transitory device capable of storing information, may be distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wireline) and/or wireless communications links. Examples of suitable communication interfaces include a network interface controller (NIC), wireless NIC (WNIC) or the like.

The user interfaces may include a display and/or one or more user input interfaces (e.g., input/output unit). The display may be configured to present or otherwise display information to a user, suitable examples of which include a liquid crystal display (LCD), light-emitting diode display (LED), plasma display panel (PDP) or the like. The user input interfaces may be wireline or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for implementation of a system for visualization and analysis of interested elements of a complex system including a plurality of elements, the apparatus comprising a processor and a memory storing executable instructions that in response to execution by the processor cause the apparatus to at least:

identify a diagnostic procedure from a maintenance message that identifies an element-level failure in the complex system, the diagnostic procedure defined for and associated with the maintenance message, involved elements in the diagnostic procedure including any failed element and elements that are checked or interacted with to identify the failed element, and implicated elements in the diagnostic procedure including elements that interconnect the involved elements, the interested elements of the complex system including the involved elements and the implicated elements;

generate a visual presentation of at least a portion of a digital three-dimensional (3D) model of the complex system, the visual presentation being digital media and depicting 3D objects that correspond to the interested elements and one or more other elements of the plurality of elements; and apply a visual effect to the 3D objects of the 3D model that correspond to the interested elements depicted by the visual presentation to distinguish the interested elements from the one or more other elements depicted by the visual presentation, the interested elements and thereby the 3D objects that correspond to the interested elements including respectively at least one interested element and 3D object for the diagnostic procedure and correspondingly the maintenance message for and with which the diagnostic procedure is defined and associated.

2. The apparatus of claim 1, wherein the apparatus being caused to identify the diagnostic procedure from the maintenance message includes being caused to identify a plurality of diagnostic procedures from a plurality of maintenance messages, the interested elements including the involved elements and the implicated elements in the plurality of diagnostic procedures, wherein the interested elements includes a first one or more interested elements involved or implicated by a first of the plurality of diagnostic procedures, and a second one or more interested elements involved in or implicated by a second of the plurality of diagnostic procedures, and wherein the apparatus being caused to apply the visual effect includes being caused to vary a property of the visual effect applied between the first one or more interested elements and the second one or more interested elements to distinguish the first one or more interested elements and the second one or more interested elements from one another.

3. The apparatus of claim 1, wherein the memory stores further executable instructions that in response to execution by the processor cause the apparatus to further:

analyze the interested elements to identify a key interested element from the interested elements, wherein the apparatus being caused to apply the visual effect includes being caused to vary a property of the visual effect applied to the key interested element, or apply a second visual effect to the key interested element, to further distinguish the key interested element from other interested elements.

4. The apparatus of claim 3, wherein the apparatus being caused to analyze the interested elements includes being caused to at least:

generate a graph including a plurality of vertices connected by edges, the plurality of vertices corresponding to respective elements of the interested elements, and the edges representing respective connections between the interested elements; and analyze the graph to identify a key vertex from the plurality of vertices, the key vertex corresponding to the key interested element of the interested elements.

5. The apparatus of claim 4, wherein the apparatus being caused to generate the graph includes being caused to generate the graph in which the edges represent the respective connections that are physical, electrical, hydraulic, airflow, data communication or fluid connections between the interested elements.

6. The apparatus of claim 4, wherein the apparatus being caused to analyze the graph includes being caused to analyze the graph to identify the key vertex that among the plurality of vertices has a greatest number of the edges connected thereto.

7. A method comprising:

identifying a diagnostic procedure from a maintenance message that identifies an element-level failure in a complex system including a plurality of elements, the diagnostic procedure defined for and associated with the maintenance message, involved elements in the diagnostic procedure including any failed element and elements that are checked or interacted with to identify the failed element, and implicated elements in the diagnostic procedure including elements that interconnect the involved elements, the interested elements of the complex system including the involved elements and the implicated elements;

generating a visual presentation of at least a portion of a digital three-dimensional (3D) model of the complex system, the visual presentation being digital media and depicting 3D objects that correspond to the interested elements and one or more other elements of the plurality of elements; and applying a visual effect to the 3D objects of the 3D model that correspond to the interested elements depicted by the visual presentation to distinguish the interested elements from the one or more other elements depicted by the visual presentation, the interested elements and thereby the 3D objects that correspond to the interested elements including respectively at least one interested element and 3D object for the diagnostic procedure and correspondingly the maintenance message for and with which the diagnostic procedure is defined and associated.

8. The method of claim 7, wherein identifying the diagnostic procedure from the maintenance message includes identifying a plurality of diagnostic procedures from a plurality of maintenance messages, the interested elements including the involved elements and the implicated elements in the plurality of diagnostic procedures, wherein the interested elements includes a first one or more interested elements involved or implicated by a first of the plurality of diagnostic procedures, and a second one or more interested elements involved in or implicated by a second of the plurality of diagnostic procedures, and wherein applying the visual effect includes varying a property of the visual effect applied between the first one or more interested elements and the second one or more interested elements to distinguish the first one or more interested elements and the second one or more interested elements from one another.

9. The method of claim 7 further comprising:

analyzing the interested elements to identify a key interested element from the interested elements, wherein applying the visual effect includes varying a property of the visual effect applied to the key interested element, or applying a second visual effect to the key interested element, to further distinguish the key interested element from other interested elements.

10. The method of claim 9, wherein analyzing the interested elements comprises:

generating a graph including a plurality of vertices connected by edges, the plurality of vertices corresponding to respective elements of the interested elements, and the edges representing respective connections between the interested elements; and analyzing the graph to identify a key vertex from the plurality of vertices, the key vertex corresponding to the key interested element of the interested elements.

11. The method of claim 10, wherein generating the graph includes generating the graph in which the edges represent the respective connections that are physical, electrical, hydraulic, airflow, data communication or fluid connections between the interested elements.

12. The method of claim 10, wherein analyzing the graph includes analyzing the graph to identify the key vertex that among the plurality of vertices has a greatest number of the edges connected thereto.

13. A non-transitory computer-readable storage medium having computer-readable program code portions stored therein that, in response to execution by a processor, cause an apparatus to at least:

identify a diagnostic procedure from a maintenance message that identifies an element-level failure in a complex system including a plurality of elements, the diagnostic procedure defined for and associated with the maintenance message, involved elements in the diagnostic procedure including any failed element and elements that are checked or interacted with to identify the failed element, and implicated elements in the diagnostic procedure including elements that interconnect the involved elements, the interested elements of the complex system including the involved elements and the implicated elements;

generate a visual presentation of at least a portion of a digital three-dimensional (3D) model of the complex system, the visual presentation being digital media and depicting 3D objects that correspond to the interested elements and one or more other elements of the plurality of elements; and apply a visual effect to the 3D objects of the 3D model that correspond to the interested elements depicted by the visual presentation to distinguish the interested elements from the one or more other elements depicted by the visual presentation, the interested elements and thereby the 3D objects that correspond to the interested elements including respectively at least one interested element and 3D object for the diagnostic procedure and correspondingly the plurality of maintenance message for and with which the diagnostic procedure is defined and associated.

14. The non-transitory computer-readable storage medium of claim 13, wherein the apparatus being caused to identify the diagnostic procedure from the maintenance message includes being caused to identify a plurality of diagnostic procedures from a plurality of maintenance messages, the interested elements including the involved elements and the implicated elements in the plurality of diagnostic procedures, wherein the interested elements includes a first one or more interested elements involved or implicated by a first of the plurality of diagnostic procedures, and a second one or more interested elements involved in or implicated by a second of the plurality of diagnostic procedures, and wherein the apparatus being caused to apply the visual effect includes being caused to vary a property of the visual effect applied between the first one or more interested elements and the second one or more interested elements to distinguish the first one or more interested elements and the second one or more interested elements from one another.

15. The non-transitory computer-readable storage medium of claim 13 having further readable program code portions stored therein that, in response to execution by the processor, cause the apparatus to further at least:

analyze the interested elements to identify a key interested element from the interested elements, wherein the apparatus being caused to apply the visual effect includes being caused to vary a property of the visual effect applied to the key interested element, or apply a second visual effect to the key interested element, to further distinguish the key interested element from other interested elements.

16. The non-transitory computer-readable storage medium of claim 15, wherein the apparatus being caused to analyze the interested elements includes being caused to at least:

generate a graph including a plurality of vertices connected by edges, the plurality of vertices corresponding to respective elements of the interested elements, and the edges representing respective connections between the interested elements; and analyze the graph to identify a key vertex from the plurality of vertices, the key vertex corresponding to the key interested element of the interested elements.

17. The non-transitory computer-readable storage medium of claim 16, wherein the apparatus being caused to generate the graph includes being caused to generate the graph in which the edges represent the respective connections that are physical, electrical, hydraulic, airflow, data communication or fluid connections between the interested elements.

18. The non-transitory computer-readable storage medium of claim 16, wherein the apparatus being caused to analyze the graph includes being caused to analyze the graph to identify the key vertex that among the plurality of vertices has a greatest number of the edges connected thereto.

* * * * *